(12) United States Patent
Cheon

(10) Patent No.: US 10,792,886 B2
(45) Date of Patent: Oct. 6, 2020

(54) DECORATIVE FILM AND ELECTRONIC DEVICE INCLUDING THE SAME

(71) Applicant: Samsung Display Co., Ltd., Yongin-si, Gyeonggi-do (KR)

(72) Inventor: Kyu Hyeong Cheon, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 49 days.

(21) Appl. No.: 15/826,006

(22) Filed: Nov. 29, 2017

(65) Prior Publication Data

US 2018/0147810 A1 May 31, 2018

(30) Foreign Application Priority Data

Nov. 29, 2016 (KR) ........................ 10-2016-0160461

(51) Int. Cl.
*B32B 3/26* (2006.01)
*B32B 7/12* (2006.01)
(Continued)

(52) U.S. Cl.
CPC ................ *B32B 3/266* (2013.01); *B32B 7/12* (2013.01); *B32B 27/36* (2013.01);
(Continued)

(58) Field of Classification Search
CPC ..... Y10T 428/24273; Y10T 428/24298; Y10T 428/24306; Y10T 428/24314; Y10T 428/24322; Y10T 428/24331; Y10T 428/28; Y10T 428/2848; Y10T 428/2852; Y10T 428/287; Y10T 428/2874; Y10T 428/2878; Y10T 428/2883; Y10T 428/2887; Y10T 428/2891; Y10T 428/2896; B32B 3/24; B32B 3/26;
(Continued)

(56) References Cited

U.S. PATENT DOCUMENTS 8,913,170 B1 * 12/2014 Baldwin ............... G06F 1/1686
348/333.01
9,423,639 B2   8/2016 Hongo et al.
(Continued)

FOREIGN PATENT DOCUMENTS

KR    10-2013-0104765 A    9/2013
KR    10-2015-0091971 A    8/2015

OTHER PUBLICATIONS

Machine translation (Espacenet) of KR 2013-0104765 A. Translated Apr. 5, 2019. (Year: 2019).*
(Continued)

*Primary Examiner* — Maria V Ewald
*Assistant Examiner* — Ethan A. Utt
(74) *Attorney, Agent, or Firm* — Lewis Roca Rothgerber Christie LLP

(57) ABSTRACT

A decorative film and an electronic device including the same are provided. A decorative film includes: a base layer; an adhesive layer on a surface of the base layer; a pattern layer on an opposite surface of the base layer; a coating layer on the pattern layer; and a printing layer on the coating layer, and a camera hole penetrates the printing layer, the coating layer, the pattern layer, the base layer, and the adhesive layer continuously.

16 Claims, 14 Drawing Sheets

(51) Int. Cl.
*H05K 5/00* (2006.01)
*H05K 5/03* (2006.01)
*H05K 5/02* (2006.01)
*B32B 27/36* (2006.01)
*H04N 5/225* (2006.01)
*H04M 1/02* (2006.01)

(52) U.S. Cl.
CPC ....... *H04M 1/0264* (2013.01); *H04M 1/0283* (2013.01); *H04N 5/2254* (2013.01); *H05K 5/0017* (2013.01); *H05K 5/0243* (2013.01); *H05K 5/03* (2013.01); *B32B 2255/205* (2013.01); *B32B 2457/20* (2013.01); *Y10T 428/24273* (2015.01); *Y10T 428/24298* (2015.01)

(58) Field of Classification Search
CPC ......... B32B 3/266; B32B 27/00; B32B 27/06; B32B 27/08; B32B 27/16; B32B 27/18; B32B 27/20; H05K 5/03; G02B 1/00; G02B 1/04; C08J 5/18
USPC .... 428/131, 134–138, 343, 354, 355, 355 R, 428/355 EP–355 N
See application file for complete search history.

(56) References Cited

U.S. PATENT DOCUMENTS

| | | | | |
|---|---|---|---|---|
| 2009/0109330 A1* | 4/2009 | Nakano | ............... | G02B 7/08 348/374 |
| 2012/0194923 A1* | 8/2012 | Um | ............... | G02B 13/0085 359/738 |
| 2013/0313672 A1* | 11/2013 | Min | ............... | G02B 5/003 257/434 |
| 2013/0329173 A1* | 12/2013 | Jung | ............... | H05K 9/0054 349/122 |
| 2014/0050882 A1* | 2/2014 | Tsai | ............... | B32B 27/08 428/131 |
| 2014/0333830 A1* | 11/2014 | Cheon | ............... | H04N 5/2254 348/376 |
| 2015/0153775 A1* | 6/2015 | Cheng | ............... | G06F 1/1626 428/137 |
| 2015/0153776 A1* | 6/2015 | Cheng | ............... | G06F 1/1637 428/173 |
| 2015/0153853 A1* | 6/2015 | Cheng | ............... | G06F 3/041 428/137 |
| 2015/0212626 A1* | 7/2015 | Kim | ............... | G06F 3/044 345/174 |
| 2015/0285975 A1* | 10/2015 | Hwang | ............... | C09K 5/063 359/589 |
| 2017/0289324 A1* | 10/2017 | Yeo | ............... | G03B 29/00 |

OTHER PUBLICATIONS

Bansal, Rajeev. (2004). Handbook of Engineering Electromagnetics—14. Optical Communications. Taylor & Francis. Retrieved from app.knovel.com/hotlink/pdf/id:kt00CAEVB1/handbook-engineering/optical-communications (Year: 2004).*

* cited by examiner

DECORATIVE FILM AND ELECTRONIC DEVICE INCLUDING THE SAME

CROSS-REFERENCE TO RELATED APPLICATION

This application claims priority to and the benefit of Korean Patent Application No. 10-2016-0160461, filed on Nov. 29, 2016 in the Korean Intellectual Property Office, the entire disclosure of which is incorporated herein by reference.

BACKGROUND

1. Field

Aspects of embodiments of the present disclosure relate to a decorative film and an electronic device including the same.

2. Description of the Related Art

An electronic device, such as a mobile communications terminal, a digital camera, a laptop computer, a tablet computer, a monitor, and a television, for example, may include a display device for displaying images. A display device includes a display panel for creating and displaying an image, and a cover window disposed on the display panel to protect it.

Such an electronic device may include a variety of features and functions, such as capturing images and recording video. To this end, it may include a camera disposed between the display panel and the cover window.

Recently, electronic devices may further include a decorative film disposed between the display panel and the cover window for aesthetic purposes. Such a decorative film may overlap with the camera.

However, since the decorative film includes a plurality of layers, it may decrease the transmittance of light traveling toward the camera, lowering the image quality of the camera.

Further, as the layers of the decorative film may have different refractive indices, optical interference may occur, such that rainbow-like refraction, for example, may be seen on the image of the camera.

In addition, the image quality of the camera may deteriorate due to a pressed mark on a surface of the decorative film during the fabricating process or a pattern of the decorative film.

SUMMARY

According to an aspect of embodiments of the present disclosure, a decorative film is provided whereby the image quality of a camera may be improved.

According to another aspect of embodiments of the present disclosure, an electronic device including a decorative film is provided whereby the image quality of a camera may be improved.

These and other aspects, embodiments, and advantages of the present disclosure will become apparent to those of ordinary skill in the art upon review of the description and claims herein.

In accordance with one or more embodiments, a decorative film comprises: a base layer; an adhesive layer on a surface of the base layer; a pattern layer on an opposite surface of the base layer; a coating layer on the pattern layer; and a printing layer on the coating layer, wherein a camera hole penetrates the printing layer, the coating layer, the pattern layer, the base layer, and the adhesive layer continuously.

A first width of the camera hole in a surface of the adhesive layer may be smaller than a second width of the camera hole in a surface of the printing layer.

A first width of the camera hole in a surface of the adhesive layer may be greater than a second width of the camera hole in a surface of the printing layer.

The camera hole may have an inner diameter that decreases from a surface of the printing layer toward a surface of the adhesive layer or an inner diameter that increases from the surface of the printing layer toward the surface of the adhesive layer.

Side walls of the camera hole may be inclined.

The side walls of the camera hole in the adhesive layer or the side walls of the camera hole in the printing layer may be recessed along a direction perpendicular to a direction in which the camera hole penetrates.

The side walls of the camera hole may be inclined at an angle of approximately 1° to 10° with respect to a direction perpendicular to the decorative film.

The camera hole may have a trapezoidal or inverted trapezoidal cross-sectional shape.

The camera hole may have a circular shape, a polygonal shape, or a polygonal shape with rounded corners when viewed from a top.

The pattern layer may comprise an embossing pattern, and the coating layer may comprise a metallic material.

In accordance with one or more embodiments, an electronic device comprises: a display panel comprising a camera; a decorative film comprising a base layer, an adhesive layer on a surface of the base layer, a pattern layer on an opposite surface of the base layer, a coating layer on the pattern layer, and a printing layer on the coating layer and facing the display panel; and a cover window attached to the adhesive layer, wherein the decorative film comprises a camera hole penetrating the printing layer, the coating layer, the pattern layer, the base layer, and the adhesive layer continuously, and wherein the camera hole overlaps with the camera.

A first width of the camera hole in a surface of the adhesive layer may be smaller than a second width of the camera hole in a surface of the printing layer.

A first width of the camera hole in a surface of the adhesive layer may be greater than a second width of the camera hole in a surface of the printing layer.

The camera hole may have an inner diameter that decreases from a surface of the printing layer toward a surface of the adhesive layer or an inner diameter that increases from the surface of the printing layer toward the surface of the adhesive layer.

Side walls of the camera hole may be inclined.

The side walls of the camera hole in the adhesive layer or the side walls of the camera hole in the printing layer may be recessed along a direction perpendicular to a direction in which the camera hole penetrates.

The side walls of the camera hole may be inclined at an angle of approximately 1° to 10° with respect to a direction perpendicular to the decorative film.

The camera hole may have a trapezoidal or inverted trapezoidal cross-sectional shape.

The camera hole may have a circular shape, a polygonal shape, or a polygonal shape with rounded corners when viewed from a top.

The display panel may be an organic light-emitting display panel or a liquid-crystal display panel.

According to one or more exemplary embodiments of the present disclosure, at least the following effects described herein may be achieved.

According to one or more exemplary embodiments of the present disclosure, by forming a camera hole in a decorative film that penetrates a printing layer, a coating layer, a pattern layer, a base layer, and an adhesive layer continuously, aesthetic effects can be provided to an electronic device including the decorative film, and the image quality of a camera of the electronic device can be improved.

It is noted that effects of the present disclosure are not limited to those described above, and other effects of the present disclosure will be apparent to those skilled in the art from the following description.

BRIEF DESCRIPTION OF THE DRAWINGS

The above and other aspects and features of the present disclosure will become more apparent by describing in further detail some exemplary embodiments thereof with reference to the attached drawings, in which.

DETAILED DESCRIPTION

Aspects, advantages, and features of the present invention and methods of accomplishing the same may be understood more readily by reference to the following description of some exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will be defined by the appended claims.

It is also to be understood that when a layer is referred to as being "on" another layer or substrate, it may be directly on the other layer or substrate, or one or more intervening layers or substrates may also be present. The same reference numbers are used to indicate the same or like components throughout the specification and drawings.

It will be understood that, although the terms "first," "second," "third," etc. may be used herein to describe various elements, components, regions, layers, and/or sections, these elements, components, regions, layers, and/or sections should not be limited by these terms. Rather, these terms are used to distinguish one element, component, region, layer, or section from another element, component, region, layer, or section. Thus, a "first" element, component, region, layer, or section described below could be termed a "second" element, component, region, layer, or section without departing from the teachings of the present invention.

Herein, some exemplary embodiments of the present disclosure will be described with reference to the accompanying drawings.

Figure 1:
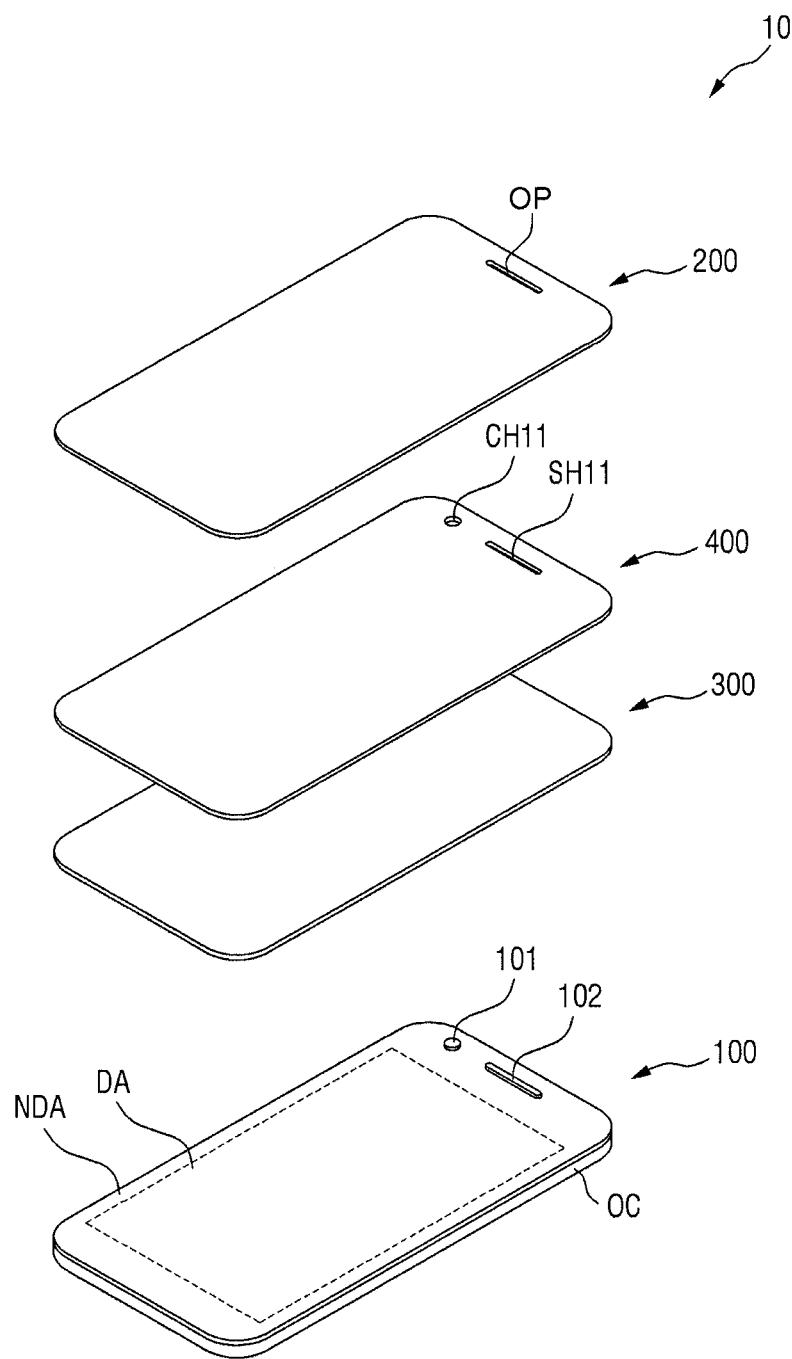
FIG. 1 is an exploded perspective view of an electronic device according to an exemplary embodiment of the present disclosure.
Figure 2:
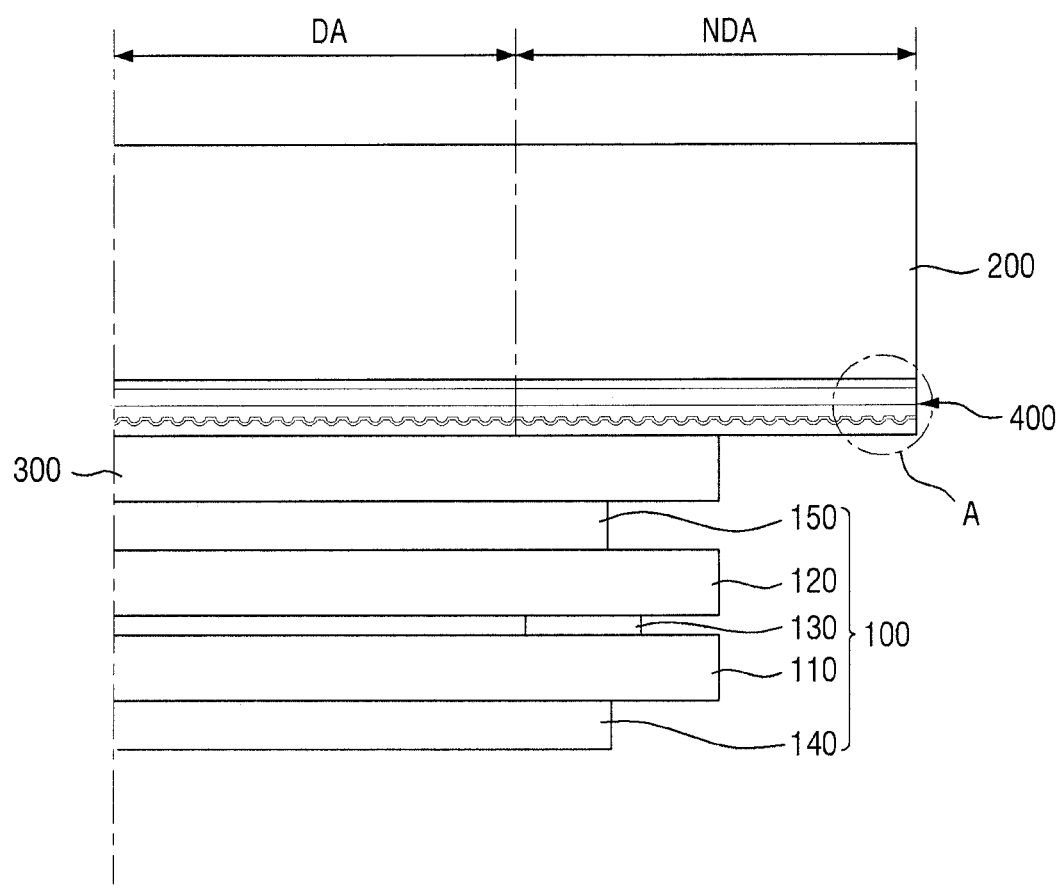
FIG. 2 is a partial cross-sectional view of a part of the electronic device of FIG. 1 when it is assembled.

FIG. 1 is an exploded perspective view of an electronic device according to an exemplary embodiment of the present disclosure; and FIG. 2 is a partial cross-sectional view of the electronic device of FIG. 1 when it is assembled.

Referring to FIGS. 1 and 2, an electronic device 10 according to an exemplary embodiment of the present disclosure may include a display panel 100, a cover window 200, an adhesive element 300, and a decorative film 400.

The electronic device 10 may be implemented as a display device for a mobile communications terminal, a digital camera, a laptop computer, a tablet computer, a monitor, and a television, for example. In the example shown in FIG. 1, the electronic device 10 is implemented as a mobile communications terminal.

In the electronic device 10, a display area DA where images are displayed, and a non-display area NDA where no image is displayed are defined. In an embodiment, the display area DA and the non-display area NDA defined in the display panel 100 shown in FIG. 1 are equally applied to the cover window 200, the adhesive element 300, and the decorative film 400.

The display panel 100 may be implemented as any of a variety of display panels, such as an organic light-emitting display panel and a liquid-crystal display panel. The display panel 100 may include a first substrate 110, a second substrate 120 disposed on the first substrate 110, a pixel pattern (not shown) disposed between the first substrate 110 and the second substrate 120, a sealing member 130 attaching the first substrate 110 to the second substrate 120, a first polarization plate 140 attached to the first substrate 110, and a second polarization plate 150 attached to the second substrate 120.

In addition, the display panel 100 may further include a camera 101 for capturing images and recording video, and a speaker 102 for receiving voice.

Although not shown in FIG. 2, in an embodiment, an outer case OC (see FIG. 1) that covers the display panel 100 and provides space for mounting electronic components is coupled to the display panel 100.

The cover window 200 is disposed on the display panel 100 and protects the display panel 100 from an external impact or the like. The cover window 200 may be made of a transparent material (e.g., tempered glass or a film of a plastic material). The cover window 200 may have an opening OP that overlaps with the speaker 102 of the display panel 100.

The adhesive element 300 is disposed between the display panel 100 and the cover window 200 and attaches the display panel 100 to the cover window 200. The adhesive element 300 may be transparent such that an image created from the display panel 100 can be seen. In an embodiment, for example, the adhesive element 300 may be an optical clear resin (OCR). According to an exemplary embodiment of the present disclosure, the decorative film 400 is disposed between the cover window 200 and the display panel 100 such that the adhesive element 300 attaches the decorative film 400 to the display panel 100.

The decorative film 400 is disposed between the cover window 200 and the display panel 100 so as to enhance the degree of design freedom and provide an aesthetic effect on the electronic device 10.

In an embodiment, the decorative film 400 may be attached to the entire surface of the cover window 200 and may include a camera hole CH11 formed in line with the camera 101 of the display panel 100, and a speaker hole SH11 formed in line with the speaker 102 of the display panel 100. Herein, a stack structure of the decorative film 400 will be described in further detail.

Figure 3:
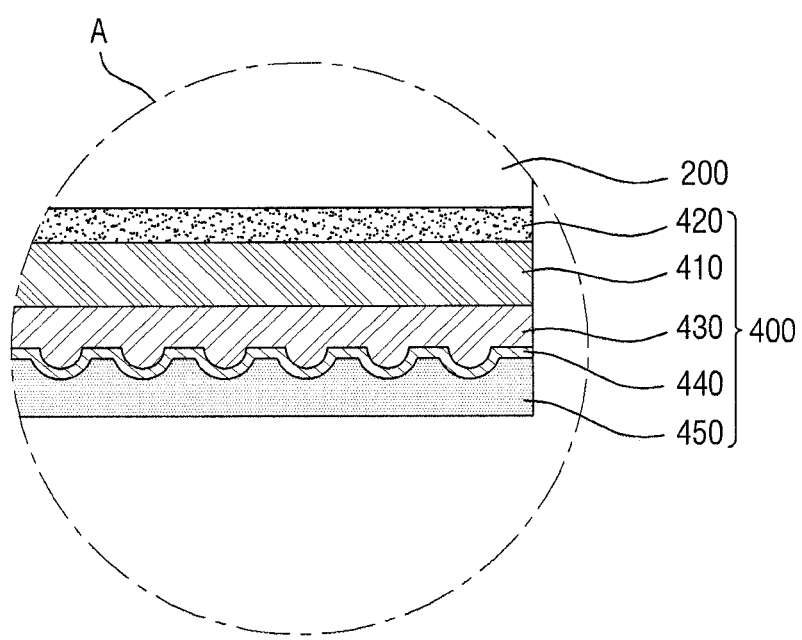
FIG. 3 is a cross-sectional view showing a stack structure in a region "A" of FIG. 2.

FIG. 3 is a cross-sectional view showing a stack structure in a region "A" of FIG. 2.

Referring to FIG. 3, in an embodiment, the decorative film 400 may include a base layer 410, an adhesive layer 420, a pattern layer 430, a coating layer 440, and a printing layer 450.

The base layer 410 may be made of a transparent material as a base layer of the decorative film 400. In an embodiment, the base layer 410 may be made of a plastic material, such as polyethylene terephthalate (PET).

The adhesive layer 420 is disposed on one surface of the base layer 410 and attaches the decorative film 400 to the cover window 200. The adhesive layer 420 may be a transparent adhesive, such as optical clear adhesive (OCA), for example.

In an embodiment, the pattern layer 430 is disposed on the other surface of the base layer 410 in the non-display area NDA. The pattern layer 430 may be formed to have an embossing pattern to substantially provide an aesthetic effect to the electronic device 10. The embossing pattern may have, but is not limited to, a hair line shape, a quadrangular shape, a circular shape, or a diamond shape when viewed from the top. In an embodiment, the pattern layer 430 may be made of an ultraviolet curable material, such as a urethane material, for example. The pattern layer 430, in an embodiment, may be formed by a molding method.

In an embodiment, the coating layer 440 is disposed on the pattern layer 430 in the non-display area NDA, and is used to provide an aesthetic effect of the electronic device 10 together with the pattern layer 430. In an embodiment, the coating layer 440 may improve the reflectivity of the pattern layer 430, provide metallic feel, and reproduce color. The coating layer 440 may be made of a metal material, such as any of $TiO_2$, indium, $Al_2O_3$, and aluminum, for example. The coating layer 440 may be formed by multiple deposition.

The printing layer 450 is disposed on the coating layer 440 in the non-display area NDA. The printing layer 450 shields the coating layer 440 such that the color can be seen. The printing layer 450 may be formed of, but is not limited to, black ink by multiple printing.

Herein, the camera hole CH11 (see FIG. 5) formed in the decorative film 400 having the above-described structure will be described in further detail.

Figure 4:
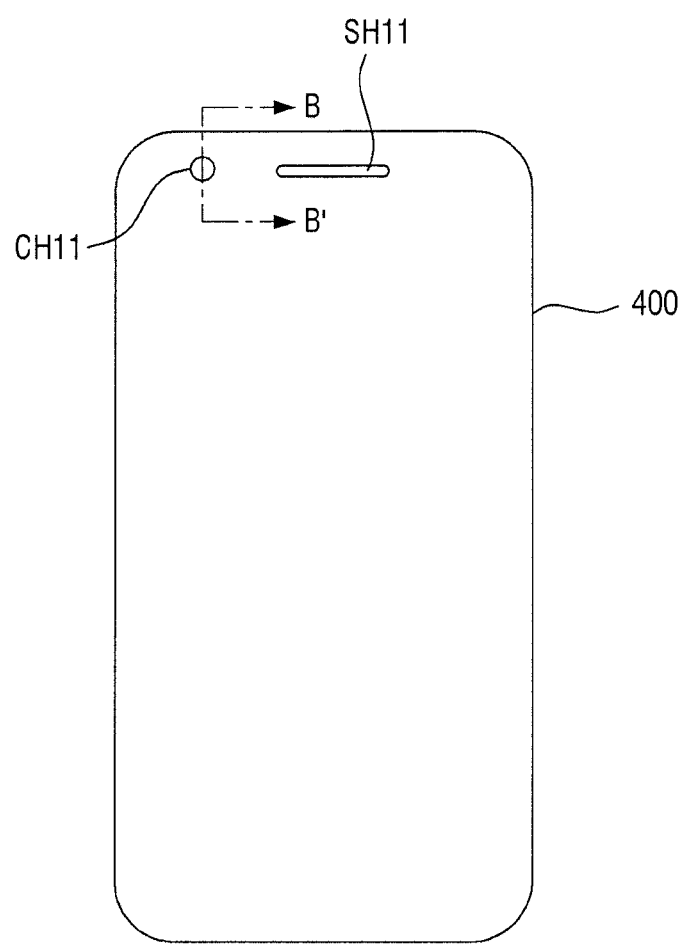
FIG. 4 is a plan view of a decorative film shown in FIG. 1.
Figure 5:
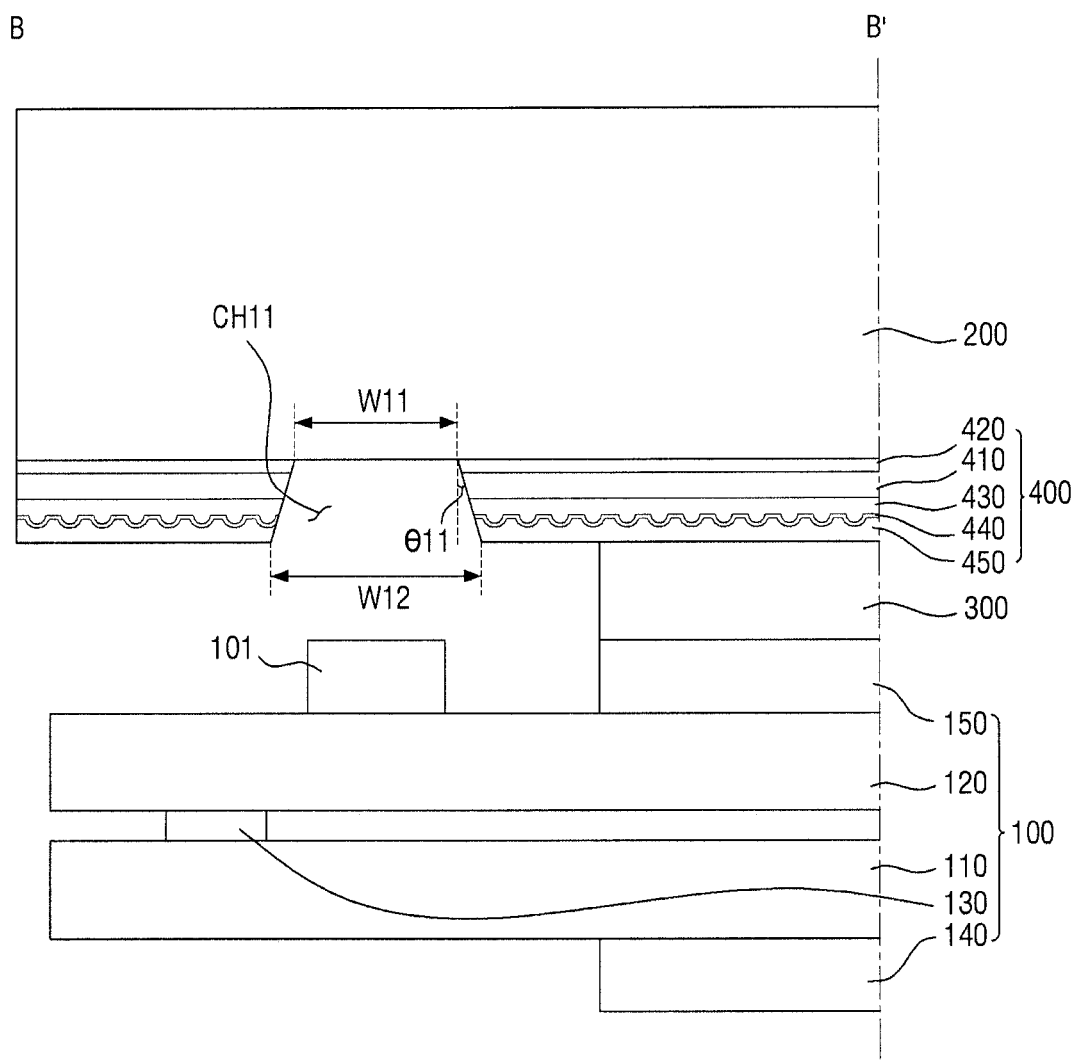
FIG. 5 is a cross-sectional view of the electronic device of FIG. 1, taken along a line B-B' of FIG. 4.
Figure 6:
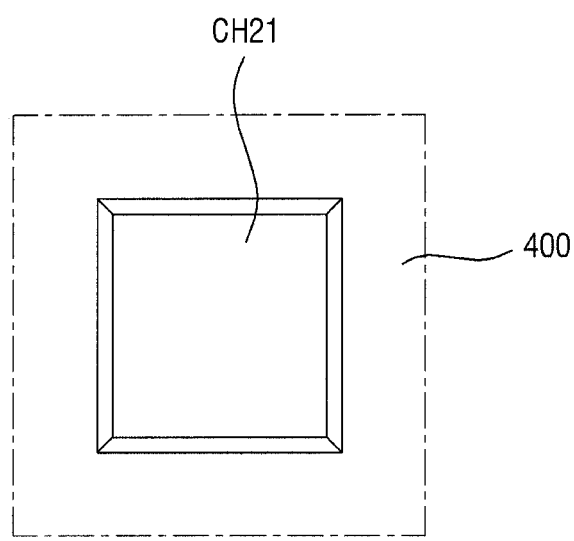
FIGS. 6 and 7 are plan views showing shapes of a camera hole of the decorative film of FIG. 4, according to various other embodiments.
Figure 7:
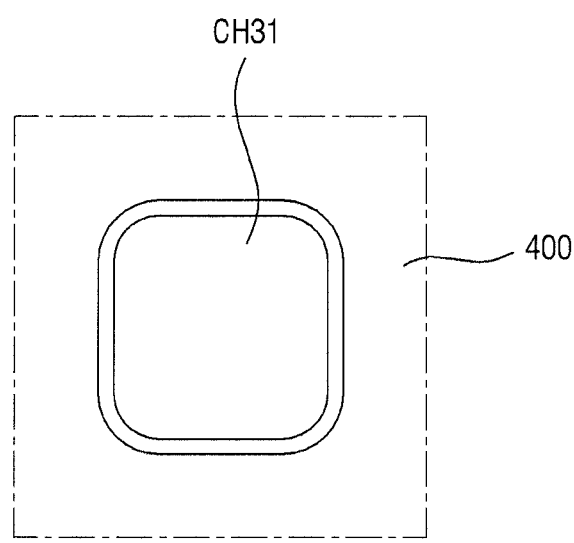

FIG. 4 is a plan view of a decorative film of FIG. 1; FIG. 5 is a cross-sectional view of the electronic device of FIG. 1, taken along a line B-B' of FIG. 4; and FIGS. 6 and 7 are plan views showing shapes of a camera hole of the decorative film of FIG. 4, according to various other embodiments.

Referring to FIGS. 4 and 5, the camera hole CH11 penetrates the printing layer 450, the coating layer 440, the pattern layer 430, the base layer 410, and the adhesive layer 420 continuously. That is, the camera hole CH11 is an open portion in the decorative film 400.

The camera hole CH11 increases the transmittance of light traveling toward the camera 101 of the display panel 100, thereby improving the image quality of the camera 101.

In addition, the camera hole CH11 eliminates the optical interference that may occur due to the different refractive indices of the layers of the decorative film 400, such that it is possible to prevent or substantially prevent a rainbow or the like caused by the optical interference from being displayed on the image of the camera 101 of the display panel 100.

In addition, the camera hole CH11 can prevent or substantially prevent the image quality of the camera 101 of the display panel 100 from deteriorating due to a pressed mark of the decorative film 400, a pattern of the decorative film 400, or the like.

Figure 12:
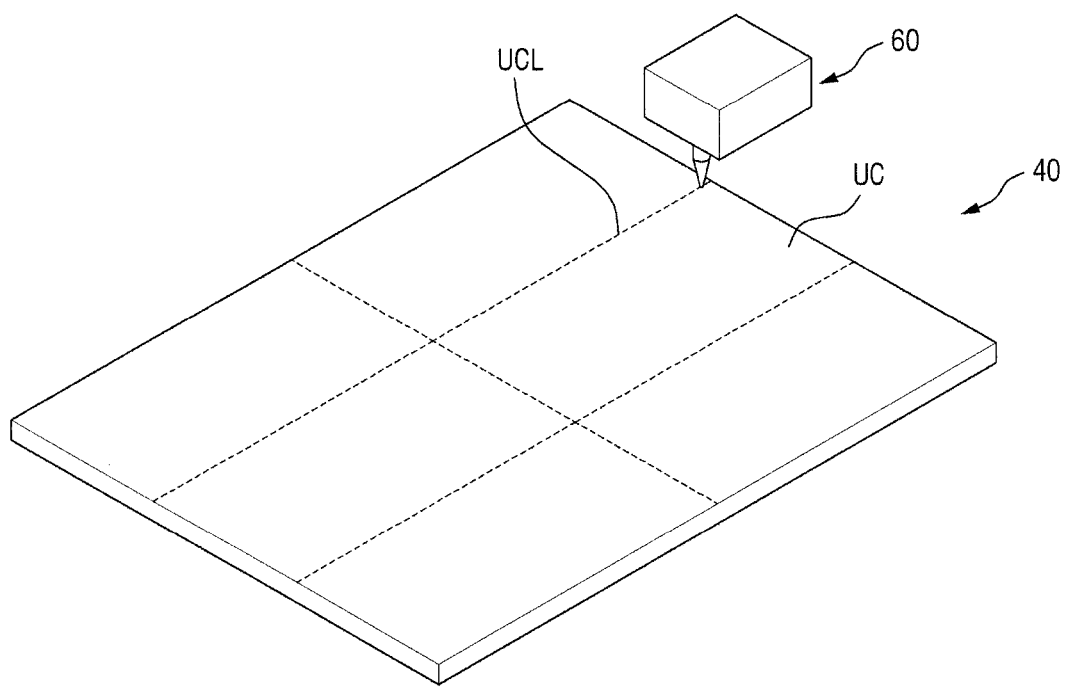
Figure 13:
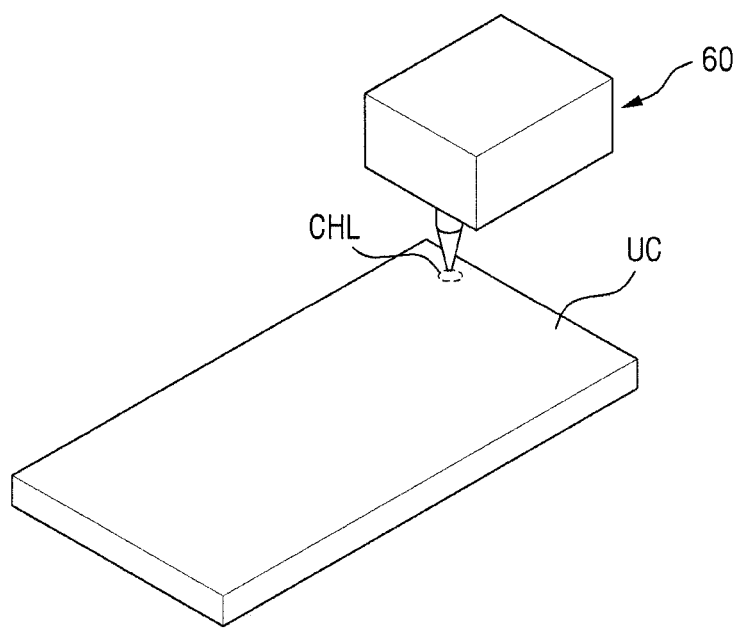

In an embodiment, the camera hole CH11 may be formed by cutting a portion of a unit cell UC (see FIG. 13) of a base decorative film 40 (see FIG. 12) that is in line with the camera 101 along a camera hole line CHL (see FIG. 13) by a laser cutting method with a laser cutter 60 (see FIG. 13).

In an embodiment, the amount of the laser energy that is output from the laser cutter 60 (see FIG. 13) to be transmitted to the unit cell UC (see FIG. 13) of the base decorative film 40 (see FIG. 12) may differ from area to area. The amount of the laser energy that is output from the laser cutter 60 (see FIG. 13) to be transmitted to the unit cell UC (see FIG. 13) of the base decorative film 40 (see FIG. 12) may decrease away from the laser cutter 60 (see FIG. 13).

Accordingly, the widths of the camera hole CH11 may differ depending on the distance from the laser cutter 60 (see FIG. 13). In other words, a first width W11 of the camera hole CH11 in an outer surface of the adhesive layer 420 may be different from a second width W12 of the camera hole CH11 in an outer surface of the printing layer 450. For example, the first width W11 may be smaller than the second width W12, such as when the laser cutter 60 (see FIG. 13) is disposed at a position facing the printing layer 450 during the forming of the camera hole CH11. In an embodiment, when the laser cutter 60 (see FIG. 13) is disposed at a position facing the printing layer 450, it is not necessary to attach a separate release paper to the printing layer 450 during the laser cutting process. In this manner, the amount of laser energy required during the laser cutting process for forming the camera hole CH11 can be reduced.

In an embodiment, the camera hole CH11 formed by the laser cutting method may have an inner diameter that decreases from the surface of the printing layer 450 toward the surface of the adhesive layer 420. The side walls of the camera hole CH11 may be inclined. In an embodiment, the camera hole CH11 may have a trapezoidal cross-sectional shape. The side walls of the camera hole CH11 may be inclined with respect to the direction perpendicular to the decorative film 400 by an angle 811 of approximately 1° to 10°. Within the above range, the camera 101 of the display panel 100 can be easily aligned with the camera hole CH11.

In an embodiment, the camera hole CH11 may be formed by concurrently (e.g., simultaneously) irradiating a laser to the printing layer 450, the coating layer 440, the pattern layer 430, the base layer 410, and the adhesive layer 420 by a laser cutting method. As a result, when the camera hole CH11 is formed in the printing layer 450 by a multiple printing method using a screen mask, it is possible to prevent or substantially prevent a printing level difference around the camera hole CH11, and, thus, it is possible to prevent or substantially prevent the function of shielding of the printing layer 450 from being lost or reduced due to the printing level difference.

Although the camera hole CH11 in FIG. 4 has a circular shape when viewed from the top, in various embodiments it may also have a polygonal shape or a polygonal shape with rounded corners. For example, a camera hole CH21 may have a quadrangular shape, as shown in FIG. 6, or a camera hole CH31 may have a square shape with rounded corners, as shown in FIG. 7.

It is to be noted that while the camera hole CH11 has been described above as being formed by the laser cutting method, the speaker hole SH11 may also be formed in the same manner as the camera hole CH11.

In addition, although not shown in the drawings, when an infrared sensor is mounted on the display panel 100, an infrared sensor hole may be formed in an area of the decorative film 400 that is in line with the infrared sensor. In this case, the infrared sensor hole may also be formed in the same manner as the camera hole CH11.

As described above, the electronic device 10 according to an exemplary embodiment of the present disclosure includes the decorative film 400 having the camera hole CH11 formed in the area overlapping with the camera 101 of the display panel 100, such that the transmittance of the light propagating toward the camera 101 of the display panel 100 can be increased, and optical interference possibly occurring due to different refractive indices of the layers of the decorative film 400 in the area overlapping with the camera 101 of the display panel 100 can be eliminated or reduced. Further, a pressed mark on the decorative film 400 in the area overlapping with the camera 101 of the display panel 100 or a pattern of the decorative film 400 can be eliminated or reduced.

As a result, by disposing the decorative film 400 between the display panel 100 and the cover window 200, the image quality of the camera 101 can be improved.

Figure 8:
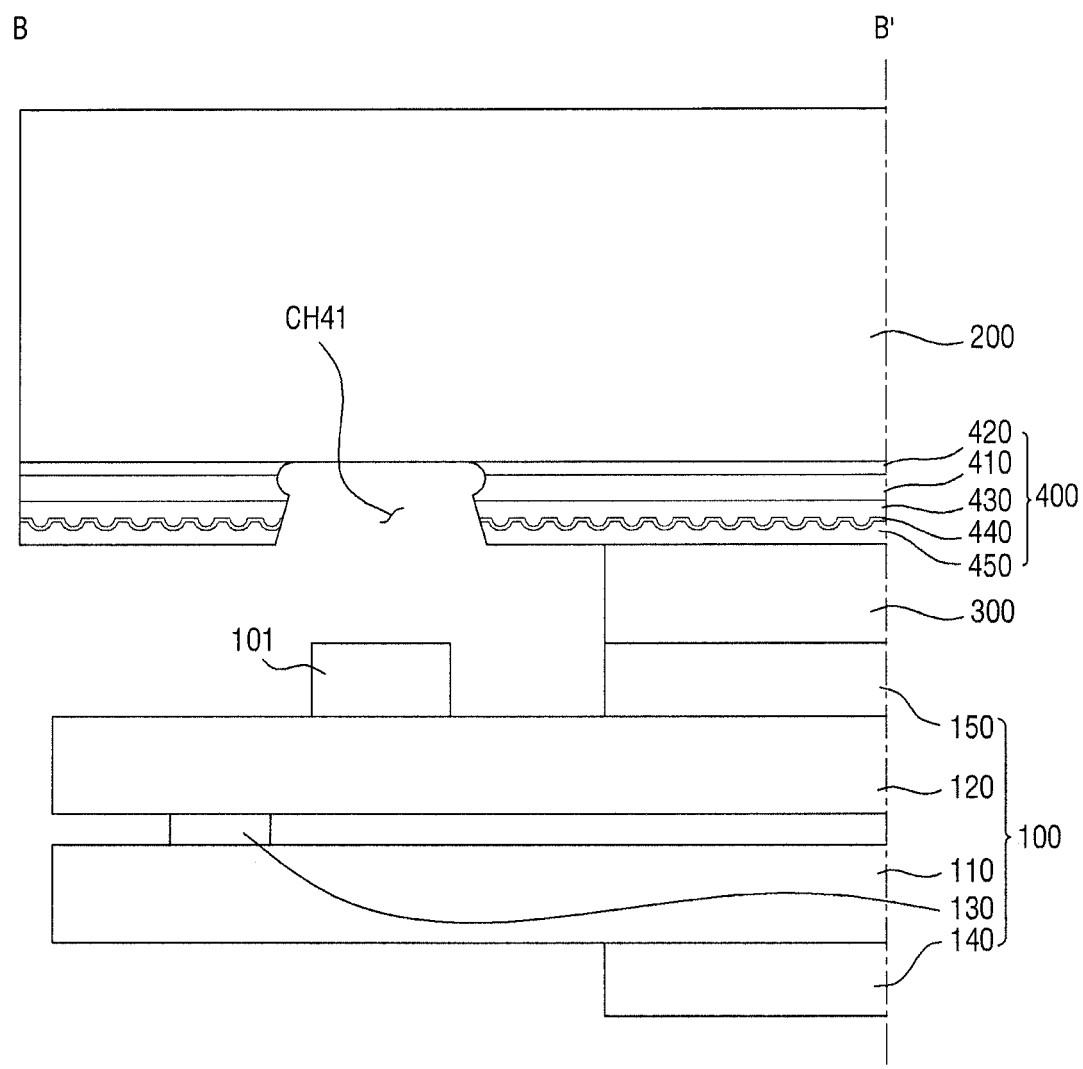
FIGS. 8 and 9 are cross-sectional views showing various embodiments of a camera hole of FIG. 5.
Figure 9:
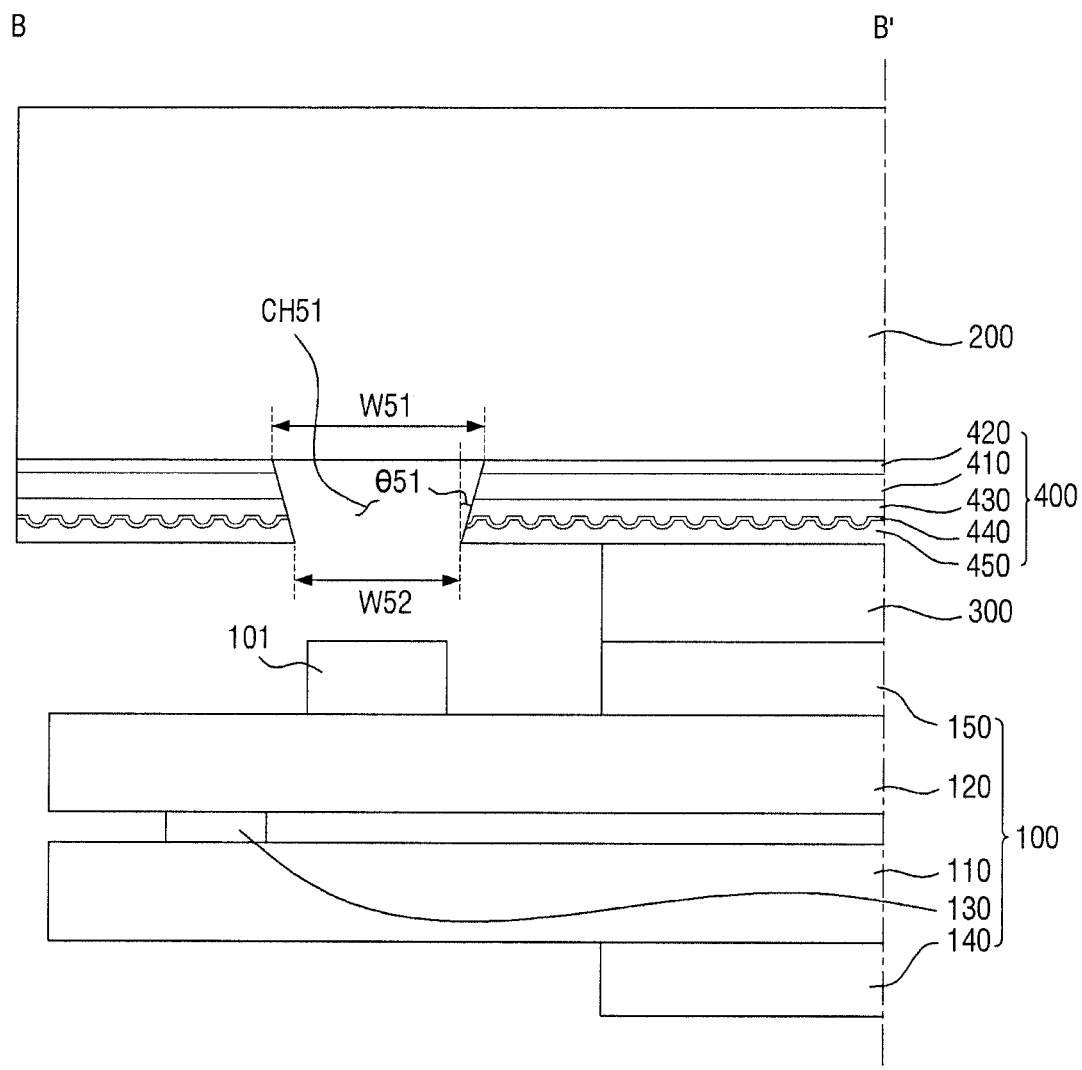

FIGS. 8 and 9 are cross-sectional views showing various embodiments of a camera hole.

FIG. 8 illustrates a camera hole CH41 having partially recessed side walls.

In an embodiment, the camera hole CH41 may have side walls recessed in the adhesive layer 420 in the direction perpendicular to the direction in which the camera hole CH41 penetrates.

The camera hole CH41 may be formed as the laser energy transmitted to the adhesive layer 420 is reflected during the formation of the camera hole CH41. The camera hole CH41 does not substantially affect the image quality of the camera 101 of the display panel 100.

FIG. 9 illustrates a camera hole CH51 that has an inverted shape of the camera hole CH1 shown in FIG. 5.

In an embodiment, the camera hole CH51 is formed when the laser cutter 60 (see FIG. 13) is disposed at a position facing the adhesive layer 420, and, thus, a first width W51 of the camera hole CH51 in an outer surface of the adhesive layer 420 may be larger than a second width W52 of the camera hole CH51 in an outer surface of the printing layer 450. In an embodiment, the camera hole CH51 may have an inner diameter that increases from the surface of the printing layer 450 toward the surface of the adhesive layer 420. The side walls of the camera hole CH51 may be inclined. In an embodiment, the camera hole CH51 may have an inverted trapezoidal cross-sectional shape. In an embodiment, the side walls of the camera hole CH51 may be inclined with respect to the direction perpendicular to the decorative film 400 by an angle 851 of approximately 1° to 10°. Within the above range, the camera 101 of the display panel 100 can be easily aligned with the camera hole CH51.

The camera hole CH51 has the increasing width away from the camera 101 of the display panel 100 toward the cover window 200, and, thus, the viewing angle of the camera 101 of the display panel 100 can be increased.

Although not shown in the drawings, it is to be understood that the side walls of the camera hole CH51 shown in FIG. 9 may be partially recessed. Then, the camera hole CH51 may have side walls recessed in the printing layer 450 in the direction perpendicular to the direction in which the camera hole CH51 penetrates.

Herein, a method for fabricating the decorative film 400 of the electronic device 10 according to an exemplary embodiment of the present disclosure will be described.

FIGS. 10 to 15 are views for illustrating a method of fabricating a decorative film shown in FIG. 1, according to an exemplary embodiment of the present disclosure.

Figure 10:
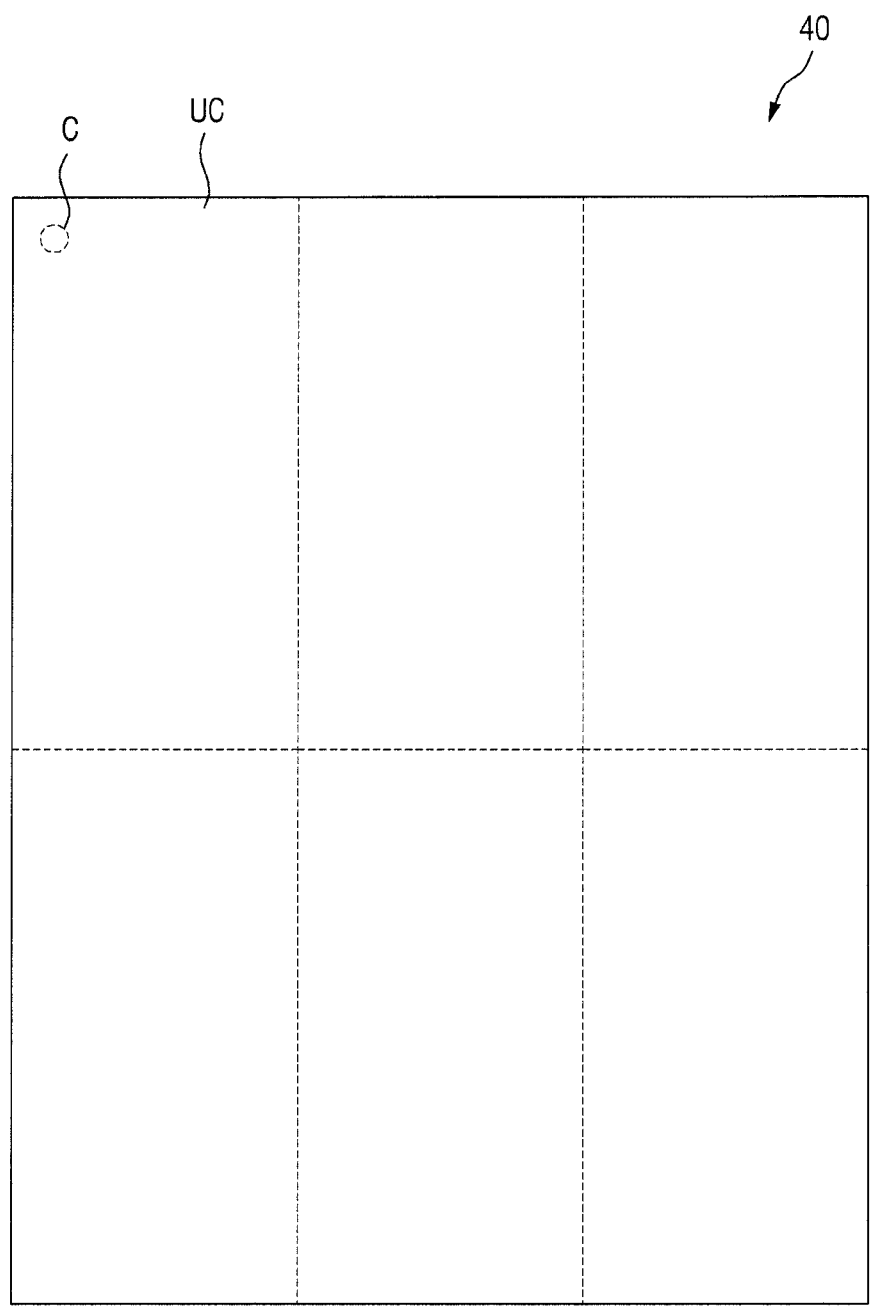
FIGS. 10 to 15 are views for illustrating a method of fabricating a decorative film shown in FIG. 1, according to an exemplary embodiment of the present disclosure.
Figure 11:
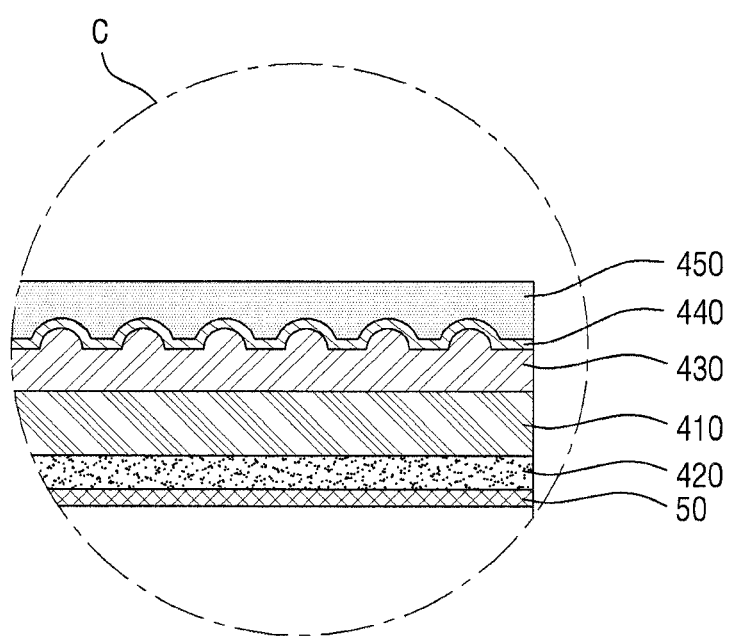

Referring to FIGS. 10 and 11, initially a base decorative film 40 is prepared.

A plurality of unit cells UC is defined in the base decorative film 40. The base decorative film 40 includes a base layer 410, an adhesive layer 420 disposed on one surface of the base layer 410, a pattern layer 430 disposed on the opposed surface of the base layer 410, a coating layer 440 disposed on the pattern layer 430, and a printing layer 450 disposed on the coating layer 440. In an embodiment, a release paper 50 is attached to an outer surface of the adhesive layer 420. The release paper 50 is removed when the cover window 200 (see FIG. 15) is attached to the adhesive layer 420.

In an embodiment, the base layer 410, the adhesive layer 420, the pattern layer 430, the coating layer 440, and the printing layer 450 are as described above, and, thus, redundant description will be omitted.

Subsequently, referring to FIG. 12, the plurality of unit cells UC is cut into individual unit cells UC by cutting along a unit cell cutting line UCL in the base decorative film 40 using the laser cutter 60.

In an embodiment, a single unit cell UC may be separated from six unit cells UC of the base decorative film 40, for example, or all of the six unit cells UC of the base decorative film 40 may be separated from one another.

Figure 14:
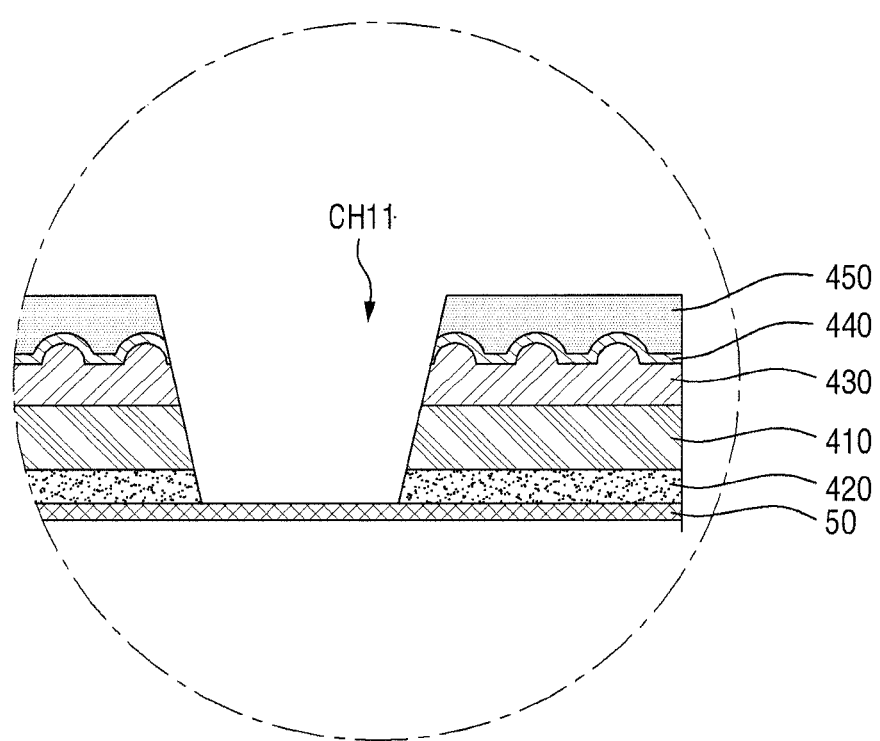

Referring to FIGS. 13 and 14, the printing layer 450, the coating layer 440, the pattern layer 430, the base layer 410, and the adhesive layer 420 are cut concurrently (e.g., simultaneously) along the camera hole cutting line CHL in the unit cell UC using the laser cutter 60, such that the camera hole CH11 is formed that penetrates the printing layer 450, the coating layer 440, the pattern layer 430, the base layer 410, and the adhesive layer 420 continuously. Although not shown in the drawings, the camera hole CH11 may extend to the release paper 50. Since the camera hole CH11 has been described above, redundant description will be omitted.

When one unit cell UC is separated from the six unit cells UC of the base decorative film 40 during the separating of the plurality of unit cells UC into individual unit cells UC, the camera hole CH11 is formed in the one unit cell UC during the forming of the camera hole CH11. Subsequently, the separating the unit cells UC into individual unit cells UC and the forming the camera holes CH11 may be alternately performed. For example, the process may be carried out in such a manner that a first unit cell UC is separated and then a camera hole CH11 is formed in the first unit cell UC, a second unit cell UC is separated and then a camera hole CH11 is formed in the second unit cell UC, and so on. It is noted that the forming the camera hole CH11 may be carried out prior to the separating the plurality of unit cells UC into individual unit cells UC.

In an embodiment, all of six unit cells UC of the base decorative film 40 may be separated from one another in the separating the plurality of unit cells UC into individual unit cells UC, and the six camera holes CH11 may be formed during the forming the camera hole CH11. That is, the separating the plurality of unit cells UC into individual unit cells UC and the forming the camera holes CH11 may not be alternately performed.

Figure 15:
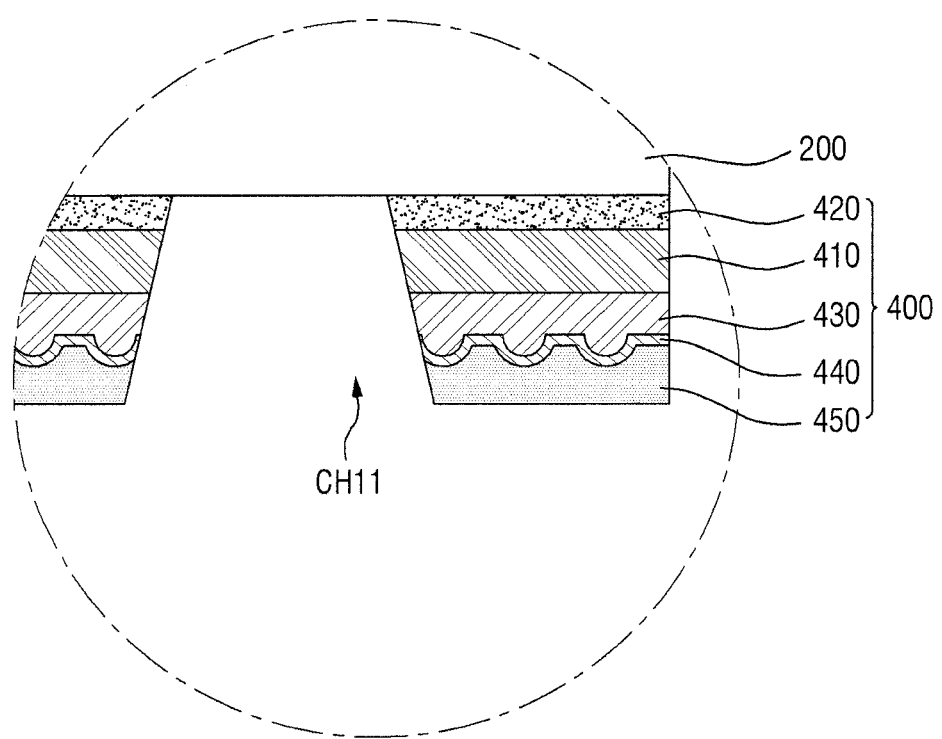

The decorative film 400 having the camera hole CH11 formed by the above-described fabricating method may be attached to the cover window 200, as shown in FIG. 15. At this time, the release paper 50 (see FIG. 14) attached to the adhesive layer 420 is removed. Subsequently, the cover window 200 having the decorative film 400 attached thereto may be attached to the display panel 100 using the adhesive element 300 (see FIG. 1).

As described above, according to the method for fabricating the decorative film 400 of the electronic device 10 according to an exemplary embodiment of the present disclosure, the camera hole CH11 of the decorative film 400 is formed by using the laser cutter used for separating the unit cells UC, such that no additional equipment is required.

In view of the above description, those skilled in the art will appreciate that many variations and modifications can be made to the described exemplary embodiments without substantially departing from the principles of the present invention. Therefore, the disclosed exemplary embodiments of the present invention are used in a generic and descriptive sense only and not for purposes of limitation.

What is claimed is:

1. A decorative film comprising:
a base layer;
an adhesive layer on a surface of the base layer;
a pattern layer on an opposite surface of the base layer;
a coating layer on the pattern layer; and
a printing layer on the coating layer,
wherein a camera hole penetrates the printing layer, the coating layer, the pattern layer, the base layer, and the adhesive layer continuously, and side walls defining the camera hole of at least one of the printing layer, the coating layer, the pattern layer, the base layer, and the adhesive layer are inclined relative to a central axis of the camera hole such that the camera hole becomes smaller in a direction from the printing layer toward the adhesive layer, and
wherein each of the printing layer, the coating layer, the pattern layer, the base layer, and the adhesive layer is exposed in the camera hole.

2. The decorative film of claim 1, wherein a first width of the camera hole in a surface of the adhesive layer is smaller than a second width of the camera hole in a surface of the printing layer.

3. The decorative film of claim 1, wherein an inner diameter of the camera hole decreases from a surface of the printing layer toward a surface of the adhesive layer.

4. The decorative film of claim 1, wherein the side walls of the camera hole in the adhesive layer or the side walls of the camera hole in the printing layer are recessed along a direction perpendicular to a direction in which the camera hole penetrates.

5. The decorative film of claim 1, wherein the side walls of the camera hole are inclined at an angle of approximately 1° to 10° with respect to a direction perpendicular to the decorative film.

6. The decorative film of claim 1, wherein the camera hole has a trapezoidal or inverted trapezoidal cross-sectional shape.

7. The decorative film of claim 1, wherein the camera hole has a circular shape, a polygonal shape, or a polygonal shape with rounded corners when viewed from a top.

8. The decorative film of claim 1, wherein the pattern layer comprises an embossing pattern, and wherein the coating layer comprises a metallic material.

9. An electronic device comprising:
a display panel comprising a camera;
a decorative film comprising a base layer, an adhesive layer on a surface of the base layer, a pattern layer on an opposite surface of the base layer, a coating layer on the pattern layer, and a printing layer on the coating layer and facing the display panel; and
a cover window attached to the adhesive layer,
wherein the decorative film comprises a camera hole penetrating the printing layer, the coating layer, the pattern layer, the base layer and the adhesive layer continuously, and side walls defining the camera hole of at least one of the printing layer, the coating layer, the pattern layer, the base layer, and the adhesive layer are inclined relative to a central axis of the camera hole such that the camera hole becomes smaller in a direction from the printing layer toward the adhesive layer,
wherein the camera hole overlaps with the camera, and
wherein each of the printing layer, the coating layer, the pattern layer, the base layer, and the adhesive layer is exposed in the camera hole.

10. The electronic device of claim 9, wherein a first width of the camera hole in a surface of the adhesive layer is smaller than a second width of the camera hole in a surface of the printing layer.

11. The electronic device of claim 9, wherein an inner diameter of the camera hole decreases from a surface of the printing layer toward a surface of the adhesive layer.

12. The electronic device of claim 9, wherein the side walls of the camera hole in the adhesive layer or the side walls of the camera hole in the printing layer are recessed along a direction perpendicular to a direction in which the camera hole penetrates.

13. The electronic device of claim 9, wherein the side walls of the camera hole are inclined at an angle of approximately 1° to 10° with respect to a direction perpendicular to the decorative film.

14. The electronic device of claim 9, wherein the camera hole has a trapezoidal or inverted trapezoidal cross-sectional shape.

15. The electronic device of claim 9, wherein the camera hole has a circular shape, a polygonal shape, or a polygonal shape with rounded corners when viewed from a top.

16. The electronic device of claim 9, wherein the display panel comprises an organic light-emitting display panel or a liquid-crystal display panel.

* * * * *